US010033361B2

United States Patent
Uesugi et al.

(10) Patent No.: US 10,033,361 B2
(45) Date of Patent: Jul. 24, 2018

(54) LEVEL-SHIFT CIRCUIT, DRIVER IC, AND ELECTRONIC DEVICE

(71) Applicant: Semiconductor Energy Laboratory Co., Ltd., Atsugi-shi, Kanagawa-ken (JP)

(72) Inventors: Wataru Uesugi, Kanagawa (JP); Takeshi Osada, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 33 days.

(21) Appl. No.: 15/387,216

(22) Filed: Dec. 21, 2016

(65) Prior Publication Data

US 2017/0187360 A1    Jun. 29, 2017

(30) Foreign Application Priority Data

Dec. 28, 2015   (JP) .................................. 2015-255855

(51) Int. Cl.
   *H03K 3/356*   (2006.01)
   *H01L 27/12*   (2006.01)
   *G09G 3/36*    (2006.01)

(52) U.S. Cl.
   CPC ..... *H03K 3/356182* (2013.01); *G09G 3/3648* (2013.01); *G09G 3/3696* (2013.01); *H01L 27/1225* (2013.01); *G09G 2300/0408* (2013.01); *G09G 2300/0871* (2013.01); *G09G 2310/0286* (2013.01)

(58) Field of Classification Search
   CPC ............. H03K 3/356182; H03K 3/012; H03K 3/356113; H03K 19/017518; G09G 3/3648; G09G 3/3696; G09G 3/20; G09G 3/3677; H01L 27/1225

USPC .......................................................... 345/212
   See application file for complete search history.

(56) References Cited

U.S. PATENT DOCUMENTS

| | | | | |
|---|---|---|---|---|
| 5,465,057 A | * | 11/1995 | Takahashi | H03K 19/017518 326/110 |
| 7,348,825 B2 | * | 3/2008 | Kimura | H03K 19/00384 327/112 |
| 8,054,279 B2 | * | 11/2011 | Umezaki | G09G 3/3677 345/100 |
| 9,105,353 B2 | | 8/2015 | Nishijima | |

(Continued)

FOREIGN PATENT DOCUMENTS

| JP | 50-151433 A | 5/1974 |
|---|---|---|
| JP | 50-151433 A | 12/1975 |

(Continued)

*Primary Examiner* — Fred Tzeng
(74) *Attorney, Agent, or Firm* — Fish & Richardson P.C.

(57) ABSTRACT

A level-shift circuit that operates stably is provided. The level-shift circuit has a function of boosting a first signal having an amplitude voltage between a first voltage and a second voltage to a second signal having an amplitude voltage between a third voltage and the second voltage. The level-shift circuit includes first to eighth transistors. Gates of the third and seventh transistors are electrically connected to a wiring for transmitting a third signal for controlling the amounts of current flowing into one of a source and a drain of the first transistor, one of a source and a drain of the second transistor, one of a source and a drain of the fifth transistor, and one of a source and a drain of the sixth transistor.

20 Claims, 14 Drawing Sheets

(56) References Cited

U.S. PATENT DOCUMENTS

| | | | |
|---|---|---|---|
| 9,136,846 B2* | 9/2015 | Henmi | H03K 19/018507 |
| 9,698,170 B2* | 7/2017 | Umezaki | H01L 27/124 |
| 2004/0124901 A1* | 7/2004 | Yamahira | H03K 3/356113 |
| | | | 327/333 |
| 2005/0017809 A1* | 1/2005 | Ueno | H03F 3/4521 |
| | | | 330/255 |
| 2005/0208922 A1* | 9/2005 | Maruyama | H03D 7/1441 |
| | | | 455/313 |
| 2010/0026619 A1* | 2/2010 | Umezaki | G11C 19/184 |
| | | | 345/100 |
| 2011/0007044 A1* | 1/2011 | Kimura | H03K 19/018507 |
| | | | 345/204 |
| 2013/0093025 A1* | 4/2013 | Miyake | G09G 3/3677 |
| | | | 257/390 |
| 2013/0264566 A1* | 10/2013 | Umezaki | G09G 3/342 |
| | | | 257/43 |
| 2014/0061638 A1* | 3/2014 | Umezaki | G09G 3/3677 |
| | | | 257/43 |
| 2015/0015474 A1* | 1/2015 | Miyake | G09G 3/3677 |
| | | | 345/100 |
| 2015/0055050 A1* | 2/2015 | Umezaki | G09G 3/20 |
| | | | 349/46 |
| 2015/0256157 A1* | 9/2015 | Kozuma | H03K 3/012 |
| | | | 327/333 |
| 2016/0254816 A1* | 9/2016 | Kobayashi | H03L 1/02 |
| | | | 331/117 FE |

FOREIGN PATENT DOCUMENTS

| | | |
|---|---|---|
| JP | 2010-041062 | 2/2010 |
| JP | 2010-041062 A | 2/2010 |
| JP | 2013-008433 A | 1/2013 |
| JP | 2015-188209 A | 10/2015 |

* cited by examiner

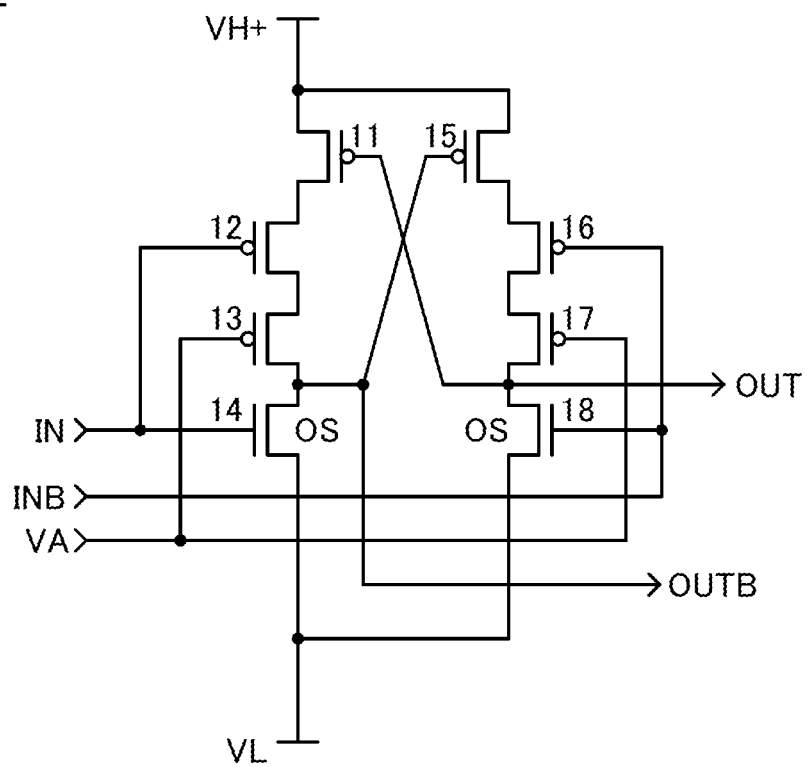

50A

50B

LEVEL-SHIFT CIRCUIT, DRIVER IC, AND ELECTRONIC DEVICE

BACKGROUND OF THE INVENTION

1. Field of the Invention

One embodiment of the present invention relates to a level-shift circuit, a driver integrated circuit (IC), and an electronic device.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter. Specific examples of the technical field of one embodiment of the present invention disclosed in this specification include a semiconductor device, a display device, a light-emitting device, a power storage device, an imaging device, a memory device, a method for driving any of them, and a method for manufacturing any of them.

2. Description of the Related Art

High-resolution display devices are widely used. ICs are used in source drivers of such display devices because high-speed operation is required. A driver formed using an IC is called a driver IC.

A driver IC including a source driver includes a shift register, a digital-to-analog converter circuit, and the like. Since the shift register and the digital-to-analog converter circuit are driven with different voltages, the source driver usually includes a level-shift circuit (see Patent Documents 1 and 2, for example).

REFERENCE

Patent Document

[Patent Document 1] Japanese Published Patent Application No. 2013-008433
[Patent Document 2] Japanese Published Patent Application No. 2015-188209

SUMMARY OF THE INVENTION

It is known that the level-shift circuit disclosed in Patent Document 1 can operate stably with an n-channel transistor having a large channel width. Unfortunately, an increase in the size of a transistor in a driver IC for driving a high-resolution display device results in an increase in the chip area.

In view of the above, an object of one embodiment of the present invention is to provide a level-shift circuit with a novel structure that can suppress an increase in its chip area. An object of one embodiment of the present invention is to provide a level-shift circuit with a novel structure that can operate stably. An object of one embodiment of the present invention is to provide a driver IC with a novel structure that can suppress an increase in its chip area. An object of one embodiment of the present invention is to provide a driver IC with a novel structure that can operate stably. An object of one embodiment of the present invention is to provide a level-shift circuit with a novel structure, a driver IC with a novel structure, a novel electronic device, or the like. An object of one embodiment of the present invention is to provide a novel semiconductor device or a novel display device.

Note that objects of one embodiment of the present invention are not limited to the aforementioned objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to achieve at least one of the aforementioned objects and the other objects.

One embodiment of the present invention is a level-shift circuit configured to boost a first signal having an amplitude voltage between a first voltage and a second voltage to a second signal having an amplitude voltage between a third voltage and the second voltage. The level-shift circuit includes a first transistor, a second transistor, a third transistor, a fourth transistor, a fifth transistor, a sixth transistor, a seventh transistor, and an eighth transistor. The first transistor, the second transistor, the fifth transistor, and the sixth transistor are p-channel transistors. The fourth transistor and the eighth transistor are n-channel transistors. One of a source and a drain of the first transistor is electrically connected to a wiring for transmitting the third voltage. The other of the source and the drain of the first transistor is electrically connected to one of a source and a drain of the second transistor. The other of the source and the drain of the second transistor is electrically connected to one of a source and a drain of the third transistor. The other of the source and the drain of the third transistor is electrically connected to one of a source and a drain of the fourth transistor and a gate of the fifth transistor. The other of the source and the drain of the fourth transistor is electrically connected to a wiring for transmitting the second voltage. One of a source and a drain of the fifth transistor is electrically connected to the wiring for transmitting the third voltage. The other of the source and the drain of the fifth transistor is electrically connected to one of a source and a drain of the sixth transistor. The other of the source and the drain of the sixth transistor is electrically connected to one of a source and a drain of the seventh transistor. The other of the source and the drain of the seventh transistor is electrically connected to one of a source and a drain of the eighth transistor and a gate of the first transistor. The other of the source and the drain of the eighth transistor is electrically connected to the wiring for transmitting the second voltage. A gate of the second transistor and a gate of the fourth transistor are electrically connected to a wiring for transmitting the first signal. A gate of the sixth transistor and a gate of the eighth transistor are electrically connected to a wiring for transmitting an inverted signal of the first signal. A gate of the third transistor and a gate of the seventh transistor are electrically connected to a wiring for transmitting a third signal that controls the amounts of current flowing into the one of the source and the drain of the first transistor, the one of the source and the drain of the second transistor, the one of the source and the drain of the fifth transistor, and the one of the source and the drain of the sixth transistor. A wiring for transmitting the second signal is electrically connected to the other of the source and the drain of the seventh transistor, the one of the source and the drain of the eighth transistor, and the gate of the first transistor.

In the level-shift circuit having the above structure, the fourth transistor and the eighth transistor may each include a semiconductor layer where a channel is formed. The semiconductor layer may include an oxide semiconductor.

In the level-shift circuit having either of the above structures, at least one of the fourth transistor and the eighth transistor may include a back gate.

In the level-shift circuit having any of the above structures, the third transistor and the seventh transistor may each be a p-channel transistor. Alternatively, in the level-shift circuit having any of the above structures, the third transistor and the seventh transistor may each be an n-channel transistor including a semiconductor layer where a channel is formed. The semiconductor layer may include an oxide semiconductor.

One embodiment of the present invention is a driver IC including the level-shift circuit having any of the above structures and at least one of a shift register, a data latch, a pass transistor logic, a voltage generator circuit, and an amplifier.

One embodiment of the present invention is an electronic device including the level-shift circuit having any of the above structures and a display portion.

According to one embodiment of the present invention, a level-shift circuit with a novel structure that can suppress an increase in its chip area can be provided. According to one embodiment of the present invention, a level-shift circuit with a novel structure that can operate stably can be provided. According to one embodiment of the present invention, a driver IC with a novel structure that can suppress an increase in its chip area can be provided. According to one embodiment of the present invention, a driver IC with a novel structure that can operate stably can be provided. According to one embodiment of the present invention, a level-shift circuit with a novel structure, a driver IC with a novel structure, a novel electronic device, or the like can be provided. According to one embodiment of the present invention, a novel semiconductor device or a novel display device can be provided.

Note that the effect of one embodiment of the present invention is not limited to the effects listed above. The effects described above do not disturb the existence of other effects. The other effects are the ones that are not described above and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

BRIEF DESCRIPTION OF THE DRAWINGS

FIG. 3 is a circuit diagram illustrating one embodiment of the present invention.

DETAILED DESCRIPTION OF THE INVENTION

Figure 1:
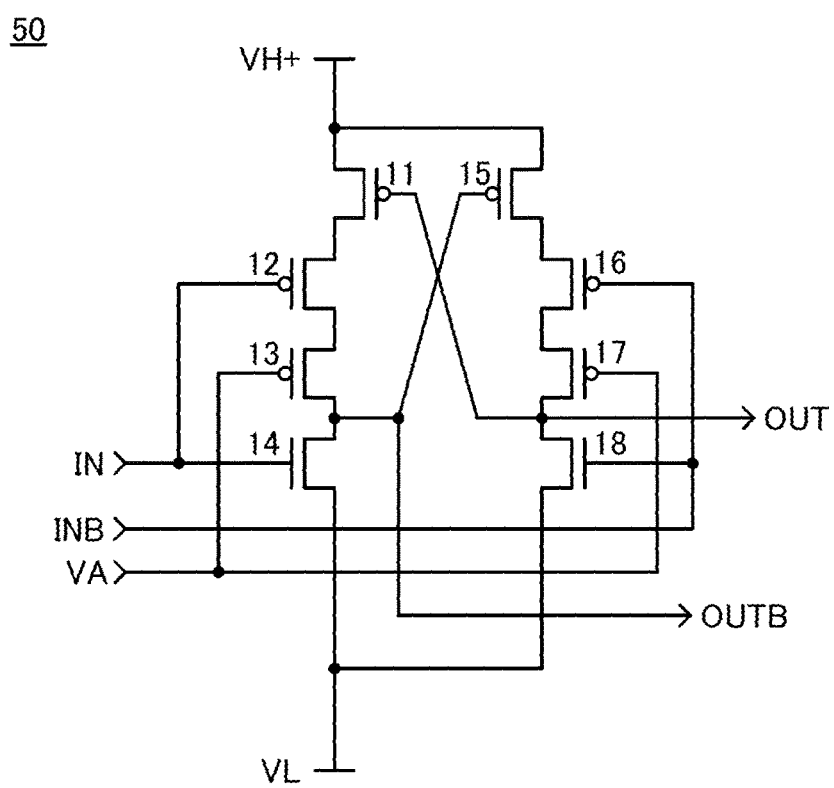
FIG. 1 is a circuit diagram illustrating one embodiment of the present invention.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as first, second, and third are used in order to avoid confusion among components. Thus, the terms do not limit the number or order of components. In the present specification and the like, a "first" component in one embodiment can be referred to as a "second" component in other embodiments or claims. Alternatively, in the present specification and the like, a "first" component in one embodiment can be omitted in other embodiments or claims.

The same elements or elements having similar functions, elements formed using the same material, elements formed at the same time, or the like in the drawings are denoted by the same reference numerals, and the description thereof is not repeated in some cases.

Embodiment 1

In this embodiment, a level-shift circuit of one embodiment of the present invention is described with reference to FIG. 1, FIGS. 2A and 2B, FIG. 3, FIG. 4, FIGS. 5A and 5B, and FIGS. 6A and 6B.

FIG. 1 illustrates a structure example of a level-shift circuit 50 of one embodiment of the present invention.

The level-shift circuit 50 illustrated in FIG. 1 includes a transistor 11, a transistor 12, a transistor 13, a transistor 14, a transistor 15, a transistor 16, a transistor 17, and a transistor 18. In FIG. 1, the transistors 11, 12, 13, 15, 16, and 17 are p-channel transistors, and the transistors 14 and 18 are n-channel transistors.

When an input signal IN having an amplitude voltage between a voltage VH and a voltage VL is input, the level-shift circuit 50 outputs an output signal OUT having an amplitude voltage between a voltage VH+ and the voltage VL. When the input signal IN is input, the level-shift circuit 50 outputs the output signal OUT having an amplitude voltage higher than the amplitude voltage of the input signal IN.

When an input signal INB having an amplitude voltage between the voltage VH and the voltage VL is input, the level-shift circuit 50 outputs an output signal OUTB having an amplitude voltage between the voltage VH+ and the voltage VL. When the input signal INB is input, the level-shift circuit 50 outputs the output signal OUTB having an amplitude voltage higher than the amplitude voltage of the input signal INB.

One of a source and a drain of the transistor 11 is electrically connected to a wiring for transmitting the voltage VH+, and the other of the source and the drain of the transistor 11 is electrically connected to one of a source and a drain of the transistor 12. The other of the source and the drain of the transistor 12 is electrically connected to one of a source and a drain of the transistor 13. The other of the source and the drain of the transistor 13 is electrically connected to one of a source and a drain of the transistor 14. The other of the source and the drain of the transistor 14 is electrically connected to a wiring for transmitting the voltage VL.

One of a source and a drain of the transistor 15 is electrically connected to the wiring for transmitting the voltage VH+, and the other of the source and the drain of the transistor 15 is electrically connected to one of a source and a drain of the transistor 16. The other of the source and the drain of the transistor 16 is electrically connected to one of a source and a drain of the transistor 17. The other of the source and the drain of the transistor 17 is electrically connected to one of a source and a drain of the transistor 18. The other of the source and the drain of the transistor 18 is electrically connected to the wiring for transmitting the voltage VL.

Gates of the transistors 12 and 14 are electrically connected to a wiring for transmitting the input signal IN. The input signal IN has the amplitude voltage between the voltage VH and the voltage VL. The voltage VH is higher than the voltage VL and lower than the voltage VH+.

Gates of the transistors 16 and 18 are electrically connected to a wiring for transmitting the input signal INB. The input signal INB is an inverted signal of the input signal IN.

Gates of the transistors 13 and 17 are electrically connected to a wiring for transmitting an input signal VA.

A wiring for transmitting the output signal OUT is electrically connected to the other of the source and the drain of the transistor 17, the one of the source and the drain of the transistor 18, and a gate of the transistor 11.

The output signal OUT has the amplitude voltage between the voltage VH+ and the voltage VL.

A wiring for transmitting the output signal OUTB is electrically connected to the other of the source and the drain of the transistor 13, the one of the source and the drain of the transistor 14, and a gate of the transistor 15.

The output signal OUTB has the amplitude voltage between the voltage VH+ and the voltage VL.

The input signal VA is a signal for controlling the amount of current flowing between the drain and the source of the transistor 13 and the amount of current flowing between the drain and the source of the transistor 17. The input signal VA is set to an appropriate constant voltage between the voltage VH and the voltage VH+ in order to be used for controlling the amounts of current flowing into the one of the source and the drain of the transistor 11, the one of the source and the drain of the transistor 12, the one of the source and the drain of the transistor 15, and the one of the source and the drain of the transistor 16.

The level-shift circuit 50 that is one embodiment of the present invention has a structure in which the transistors 13 and 17 are provided and the input signal VA is applied to the gates of the transistors 13 and 17. Such a structure enables the control of the amounts of current flowing into the one of the source and the drain of the transistor 11, the one of the source and the drain of the transistor 12, the one of the source and the drain of the transistor 15, and the one of the source and the drain of the transistor 16. Accordingly, the amplitude voltage of the output signal OUT can be stably made higher than the amplitude voltage of the input signal IN even when the transistors 14 and 18 are not large in size.

Specifically, in the case where the transistor 13 that is electrically connected to the other of the source and the drain of the transistor 12 is provided, the amounts of current flowing into the transistors 11 and 12 are smaller than those in the case without the transistor 13, due to the on-state resistance between the source and the drain of the transistor 13. Thus, with the transistor 13, the amounts of current flowing into the one of the source and the drain of the transistor 11 and the one of the source and the drain of the transistor 12 can be reduced, and the amounts of current flowing into the wiring through which the output signal OUTB is output and the gate of the transistor 15 can also be reduced.

Specifically, in the case where the transistor 17 that is electrically connected to the other of the source and the drain of the transistor 16 is provided, the amounts of current flowing into the transistors 15 and 16 are smaller than those in the case without the transistor 17, due to the on-state resistance between the source and the drain of the transistor 17. Thus, with the transistor 17, the amounts of current flowing into the one of the source and the drain of the transistor 15 and the one of the source and the drain of the transistor 16 can be reduced, and the amounts of current flowing into the wiring through which the output signal OUT is output and the gate of the transistor 11 can also be reduced.

Accordingly, the level-shift circuit 50 can properly make the amplitude voltage of the output signal OUT higher than the amplitude voltage of the input signal IN, even in the case where the voltage VH of the input signal IN is lower than the voltage VH+. This normal operation can be performed without an increase in the sizes of the n-channel transistors in the level-shift circuit 50. Consequently, an increase in the area occupied by the level-shift circuit 50 can be prevented, and thus the chip area can be decreased.

Accordingly, a driver IC including the level-shift circuit 50 can be favorably used in a display device that is required to have a small size and high resolution.

Figure 2A:
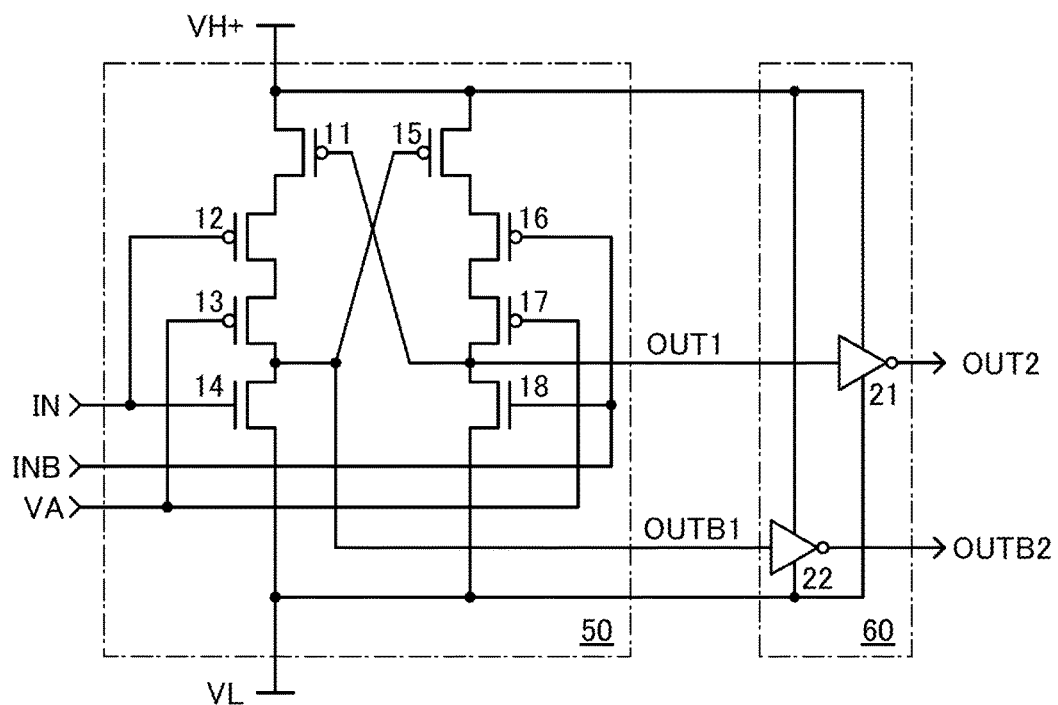
FIGS. 2A and 2B are a circuit diagram and a timing chart showing one embodiment of the present invention.
Figure 2B:
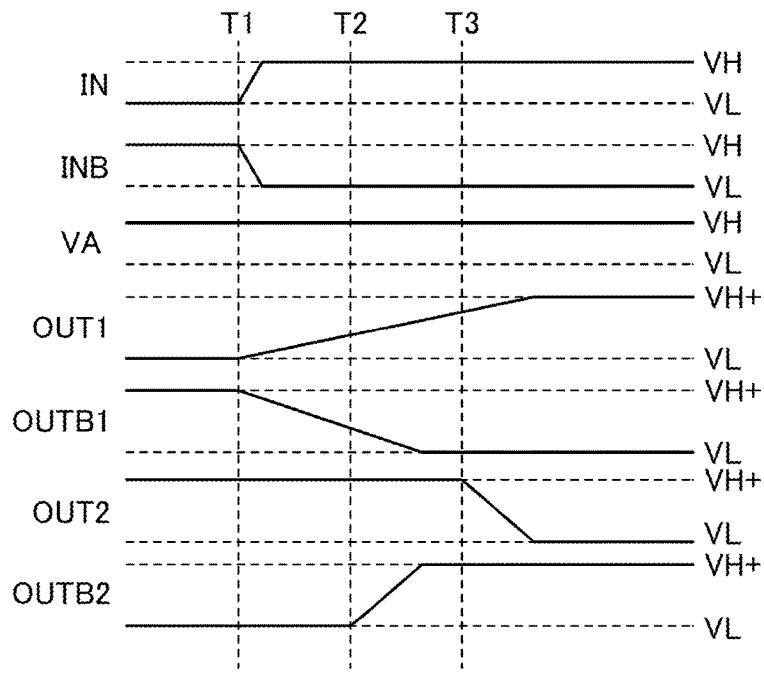

The operation of the level-shift circuit 50 is described in detail with reference to FIGS. 2A and 2B. FIG. 2A illustrates a level-shift circuit 51 including a buffer circuit 60 in addition to the level-shift circuit 50. FIG. 2B is a timing chart of the level-shift circuit 51.

The buffer circuit 60 includes an inverter circuit 21 and an inverter circuit 22.

In the level-shift circuit 51, the level-shift circuit 50 outputs an output signal OUT1 and an output signal OUTB1. The output signal OUT1 that is output from the level-shift circuit 50 is input to the inverter circuit 21. The inverter circuit 21 outputs an output signal OUT2 that is an inverted signal of the output signal OUT1. The output signal OUTB1 that is output from the level-shift circuit 50 is input to the inverter circuit 22. The inverter circuit 22 outputs an output signal OUTB2 that is an inverted signal of the output signal OUTB1.

The operation of the level-shift circuit 51 is described with reference to the timing chart in FIG. 2B. FIG. 2B shows amplitude voltages of the input signal IN, the input signal INB, the output signal OUT1, the output signal OUTB1, the output signal OUT2, the output signal OUB2, and the input signal VA.

A state before time T1 is an initial state. As shown in FIG. 2B, in the initial state, the input signal IN is set to the voltage VL, the input signal INB is set to the voltage VH, the input signal VA is set to the voltage VH, the output signal OUT1 is set to the voltage VL, the output signal OUTB1 is set to the voltage VH+, the output signal OUT2 is set to the voltage VH+, and the output signal OUTB2 is set to the voltage VL.

At the time T1, the input signal IN is set to the voltage VH, and the input signal INB is set to the voltage VL.

After the time T1, the output signal OUT1 starts to rise from the voltage VL, and the output signal OUTB1 starts to fall from the voltage VH+. At this time, due to the on-state resistance of the transistor 13, the amount of current flowing through the transistor 14 becomes larger than the amount of current flowing through each of the transistors 11, 12, and 13. Consequently, the rate of a voltage fall of the output signal OUTB1 is faster than the rate of a voltage rise of the output signal OUT1.

After time T2, the output signal OUTB2 starts to rise from the voltage VL to the voltage VH+.

After time T3, the output signal OUT2 starts to fall from the voltage VH+ to the voltage VL.

Figure 4:
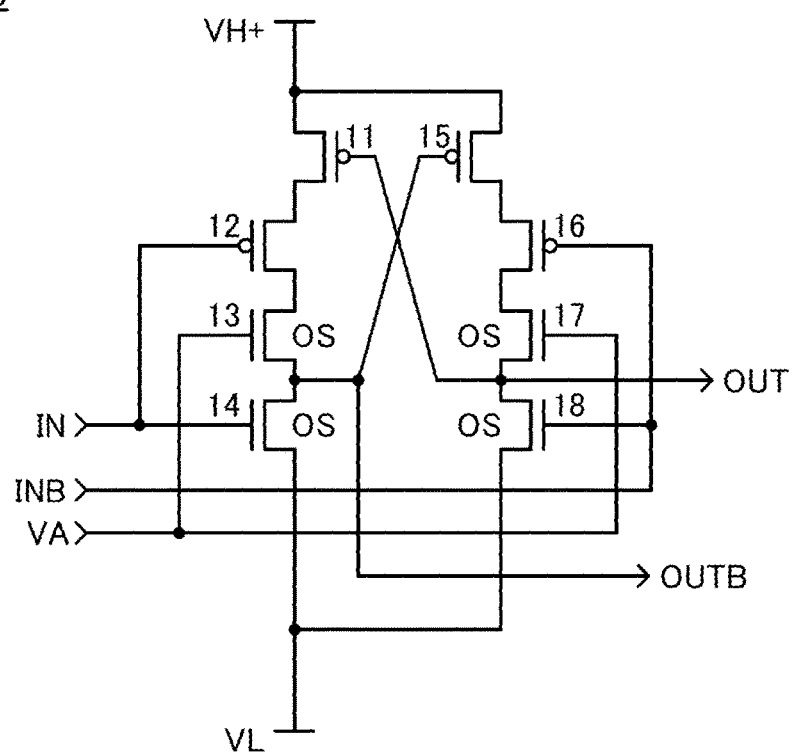
FIG. 4 is a circuit diagram illustrating one embodiment of the present invention.

FIG. 3 and FIG. 4 each illustrate another structure example of the level-shift circuit of one embodiment of the present invention. The level-shift circuits illustrated in FIG. 3 and FIG. 4 are different from the level-shift circuit illustrated in FIG. 1 in that a transistor whose channel is formed using an oxide semiconductor (such a transistor is referred to as an OS transistor below) is used. Note that in FIG. 3 and FIG. 4, a circuit symbol with "OS" indicates an OS transistor.

First, an OS transistor will be described. As an oxide contained in a semiconductor layer of an OS transistor, a metal oxide such as In—Sn—Ga—Zn oxide, In—Ga—Zn oxide, In—Sn—Zn oxide, In—Al—Zn oxide, Sn—Ga—Zn oxide, Al—Ga—Zn oxide, Sn—Al—Zn oxide, In—Zn oxide, Sn—Zn oxide, Al—Zn oxide, Zn—Mg oxide, Sn—Mg oxide, In—Mg oxide, In—Ga oxide, In oxide, Sn oxide, or Zn oxide can be used. In addition, these metal oxides may contain another material, such as $SiO_2$. An oxide semiconductor of an OS transistor preferably contains at least one of In and Zn.

By reducing impurities serving as electron donors, such as moisture or hydrogen, and also reducing oxygen vacancies, an i-type (intrinsic) or a substantially i-type oxide semiconductor can be obtained. Here, such an oxide semiconductor is referred to as a highly purified oxide semiconductor. By forming the channel using a highly purified oxide semiconductor, the off-state current of the OS transistor that is normalized by channel width can be as low as several yoctoamperes per micrometer to several zeptoamperes per micrometer.

The reason the off-state current of an OS transistor is extremely low is that the bandgap of a semiconductor made of a metal oxide is 3.0 eV or more. Since an OS transistor contains a metal oxide in its channel formation region, leakage current due to thermal excitation is low and the off-state current is extremely low.

An oxide semiconductor suitable for an OS transistor has a hydrogen concentration that is measured by secondary ion mass spectrometry (SIMS) of lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, further preferably lower than $5 \times 10^{18}$ atoms/cm$^3$, further preferably lower than or equal to $1 \times 10^{18}$ atoms/cm$^3$, further preferably lower than or equal to $5 \times 10^{17}$ atoms/cm$^3$, still further preferably lower than or equal to $1 \times 10^{16}$ atoms/cm$^3$.

In the level-shift circuit 50 illustrated in FIG. 3, OS transistors are used as the transistors 14 and 18. An OS transistor has a high withstand voltage between its source and drain. Accordingly, it is preferable to use the OS transistors as the transistors 14 and 18 because the level-shift circuit can have high withstand voltage.

In the level-shift circuit 50 illustrated in FIG. 4, OS transistors are used as the transistors 13, 14, 17, and 18. As illustrated in FIG. 4, the transistors 13 and 17 may be n-channel transistors in the case where OS transistors are used as the transistors 13 and 17. As described above, an OS transistor has a high withstand voltage between its source and drain. Accordingly, it is preferable to use the OS transistors as the transistors 13, 14, 17, and 18 because the level-shift circuit can have high withstand voltage.

Figure 5A:
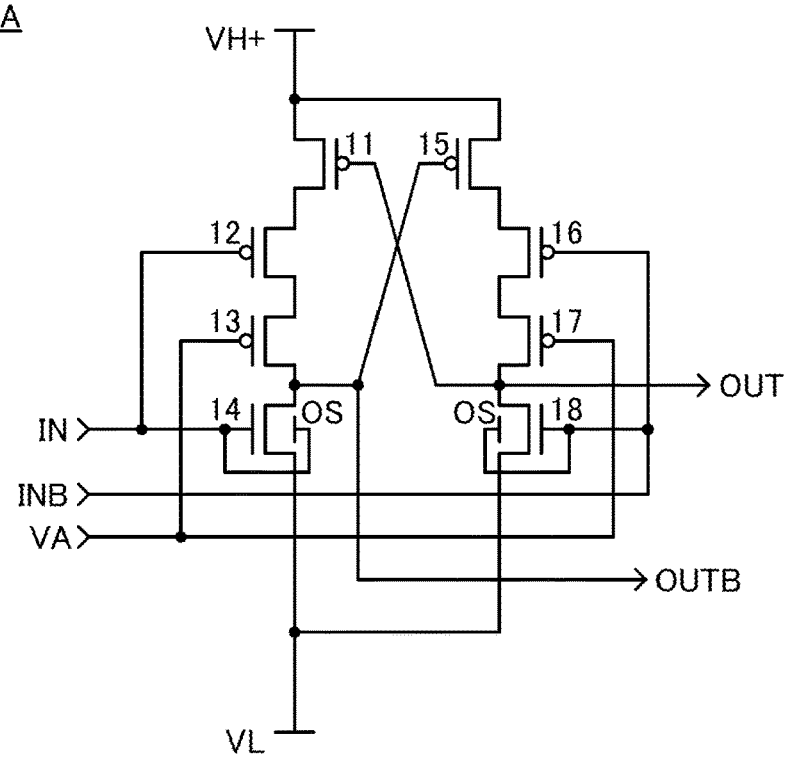
FIGS. 5A and 5B are circuit diagrams each illustrating one embodiment of the present invention.
Figure 5B:
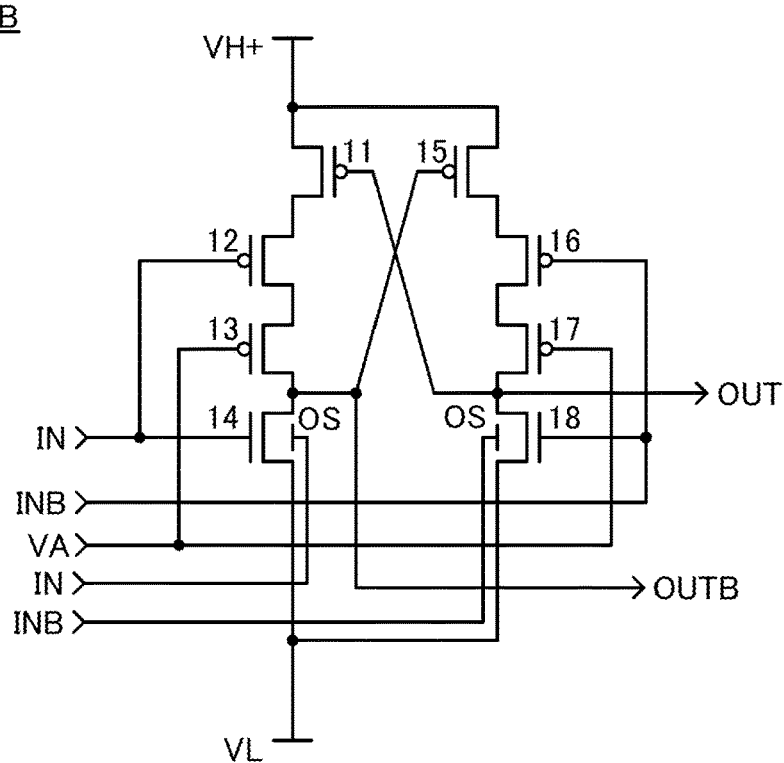

In the case where an OS transistor is used, its threshold voltage is preferably controlled by application of voltage to its back gate. FIGS. 5A and 5B are circuit diagrams each illustrating a level-shift circuit including an OS transistor with a back gate.

In a level-shift circuit 50A in FIG. 5A, the input signal IN is supplied to a gate and a back gate of the transistor 14 and the input signal INB is supplied to a gate and a back gate of the transistor 18, in order that the threshold voltages may shift negatively in a period in which the transistors 14 and 18 are on and shift positively in a period in which the transistors 14 and 18 are off. With the structure in FIG. 5A, the amount of current when the transistors are on can be increased, and in addition, the amount of current when the transistors are off can be reduced.

The same signal is supplied to the gate and the back gate of each of the transistors 14 and 18 through the same wiring in the structure in FIG. 5A, but another structure may be employed.

For example, a level-shift circuit 50B in FIG. 5B is the same as the level-shift circuit 50A in FIG. 5A in that the input signal IN is supplied to the gate and the back gate of the transistor 14 and the input signal INB is supplied to the gate and the back gate of the transistor 18, but is different in that different wirings for supplying the input signal IN or the input signal INB are connected to the gates and the back gates of the transistors 14 and 18. With the structure in FIG. 5B, an opening for connecting a gate and a back gate can be omitted in a level-shift circuit, whereby the area occupied by the circuit can be reduced.

The level-shift circuit 50 including both an OS transistor and a transistor including silicon in a channel formation region (hereinafter such a transistor is referred to as a Si transistor) is preferable because the occupied area can be reduced. An example of a circuit including both a Si transistor and an OS transistor is described with reference to FIGS. 6A and 6B.

Figure 6A:
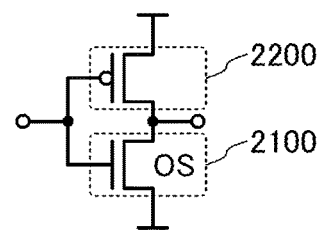
FIGS. 6A and 6B are a circuit diagram and a cross-sectional view illustrating one embodiment of the present invention.

A circuit diagram in FIG. 6A illustrates a structure of what is called a CMOS inverter in which a p-channel Si transistor 2200 and an n-channel OS transistor 2100 are connected to each other in series and gates of them are connected to each other.

Figure 6B:
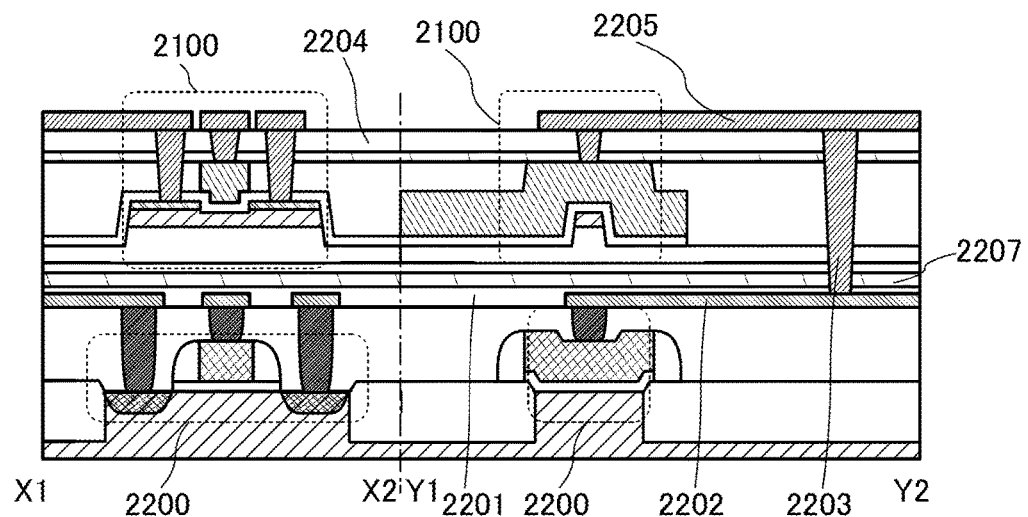

FIG. 6B is a cross-sectional view of a semiconductor device including the CMOS inverter illustrated in FIG. 6A. In FIG. 6B, X1-X2 direction is a channel length direction, and Y1-Y2 direction is a channel width direction. The semiconductor device illustrated in FIG. 6B includes the Si transistor 2200 in a lower portion and the OS transistor 2100 in an upper portion. A cross-sectional view of the transistors in a channel length direction is on the left side of a dashed-dotted line, and a cross-sectional view of the transistors in a channel width direction is on the right side of the dashed-dotted line.

FIG. 6B illustrates a structure in which the OS transistor 2100 is provided over the Si transistor 2200 with an insulator 2201 and an insulator 2207 provided therebetween. A plurality of wirings 2202 is provided between the Si transistor 2200 and the OS transistor 2100. Furthermore, wirings and electrodes provided over and under the insulators are electrically connected to each other through a plurality of plugs 2203 embedded in the insulators. An insulator 2204 covering the OS transistor 2100 and a wiring 2205 over the insulator 2204 are provided.

As described above, when two kinds of transistors are stacked, the area occupied by the level-shift circuit 50 in a substrate can be reduced.

Accordingly, to reduce the area occupied by the level-shift circuit 50 illustrated in FIG. 3, for example, p-channel Si transistors such as the transistors 11, 12, 13, 15, 16, and 17 are formed in a lower layer of a semiconductor device, and n-channel OS transistors such as the transistors 14 and 18 are formed in an upper layer of the semiconductor device.

To reduce the area occupied by the level-shift circuit 50 illustrated in FIG. 4, p-channel Si transistors such as the transistors 11, 12, 15, and 16 are formed in a lower layer of a semiconductor device, and n-channel OS transistors such as the transistors 13, 14, 17, and 18 are formed in an upper layer of the semiconductor device.

Embodiment 2

Figure 7:
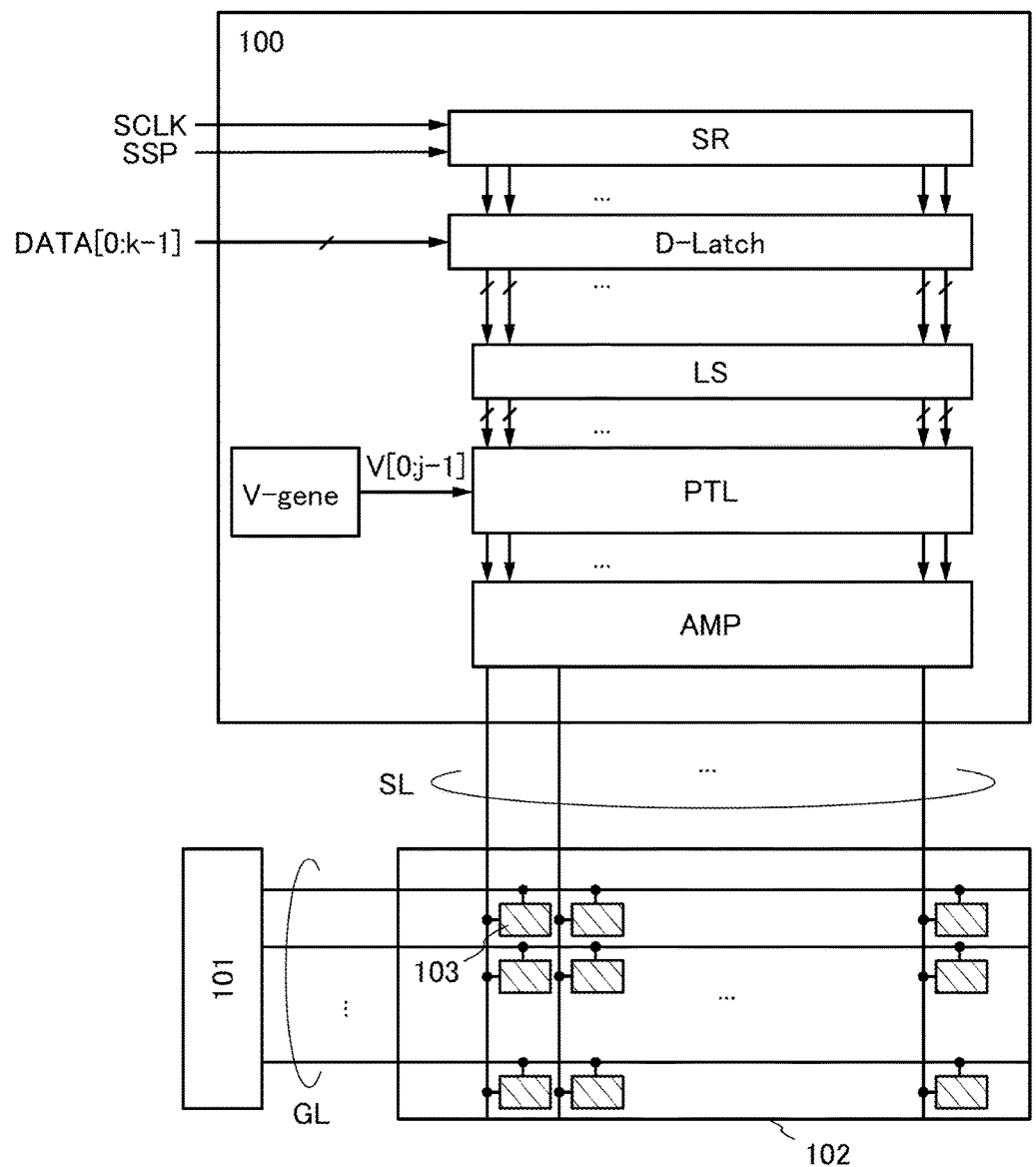
FIG. 7 is a circuit block diagram illustrating a structure example of a display device.

In this embodiment, a circuit block diagram of a display device including a level-shift circuit LS is described. Any of the level-shift circuits described in Embodiment 1 can be used as the level-shift circuit LS. FIG. 7 is a circuit block diagram illustrating a source driver, a gate driver, and a display portion.

The display device in the circuit block diagram of FIG. 7 includes a source driver 100, a gate driver 101, and a display portion 102. In the display portion 102 of FIG. 7, pixels 103 are arranged in a matrix.

The source driver 100 includes a shift register SR, a data latch D-Latch, the level-shift circuit LS, a pass transistor logic PTL, a voltage generator circuit V-gene, and an amplifier AMP. The source driver 100 has a function of outputting analog image data to a plurality of source lines SL. The source driver 100 may consist of a driver IC.

A source clock SCLK and a source start pulse SSP, for example, are input to the shift register SR. The shift register SR generates a sampling pulse and outputs it to the data latch D-Latch.

In addition to the sampling pulse, data signals DATA[0] to DATA[k-1] that are digital image data are input to the data latch D-Latch. The data signals DATA[0] to DATA[k-1] are latched into the data latch D-Latch in response to the sampling pulse. The data latch D-Latch outputs the latched data signals DATA[0] to DATA[k-1] to the level-shift circuit LS.

The level-shift circuit LS boosts the input data signals DATA[0] to DATA[k-1] to signals DECPB[0] to DECPB[k-1] and outputs the signals DECPB[0] to DECPB[k-1].

The pass transistor logic PTL controls on/off state of transistors in accordance with the signals DECPB[0] to DECPB[k-1] obtained by boosting and outputs an output signal PTL_OUT that is an analog signal corresponding to the voltages V[0] to V[j-1] generated in the voltage generator circuit V-gene.

The amplifier AMP increases the current of the output signal PTL_OUT input thereto and outputs the resulting signal as a data signal Vdata.

The data signals Vdata obtained in the amplifier AMP are analog signals output to the source lines SL.

The gate driver 101 includes a shift register and a buffer, for example. The gate driver 101 receives a gate start pulse, a gate clock signal, and the like and outputs a pulse signal. A circuit included in the gate driver 101 may be an IC as in the source driver 100 or may be formed using a transistor similar to that in the pixel 103 of the display portion 102.

The gate driver 101 outputs scan signals to a plurality of gate lines GL. Note that a plurality of gate drivers 101 may be provided to separately control the gate lines GL.

In the display portion 102, the gate lines GL and the source lines SL are provided to intersect at substantially right angles. The pixel 103 is provided at the intersection of the gate line GL and the source line SL. For color display, the pixels 103 corresponding to the respective colors of red, green, and blue (RGB) are arranged in sequence in the display portion 102. Note that the pixels of RGB can be arranged in a stripe pattern, a mosaic pattern, a delta pattern, or the like as appropriate. Without limitation to RGB, white, yellow, or the like may be added to RGB for color display.

Figure 8A:
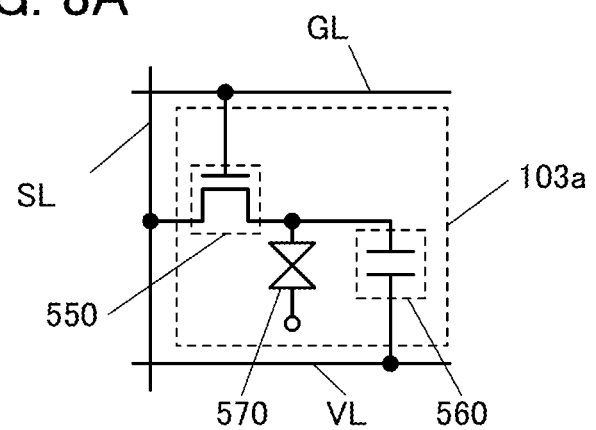
FIGS. 8A and 8B are circuit diagrams each illustrating a structure example of a pixel.

The pixel 103 in FIG. 7 can have a structure illustrated in FIG. 8A, for example.

A pixel circuit 103a illustrated in FIG. 8A includes a liquid crystal element 570, a transistor 550, and a capacitor 560.

The potential of one of a pair of electrodes of the liquid crystal element 570 is set as appropriate according to the specifications of the pixel circuit 103a. The alignment state of the liquid crystal element 570 depends on written data. A common potential may be supplied to the one of the pair of electrodes of the liquid crystal element 570 included in each of a plurality of pixel circuits 103a. The potential supplied to the one of the pair of electrodes of the liquid crystal element 570 in the pixel circuit 103a may differ between rows.

Examples of a driving method of the display device including the liquid crystal element 570 are a twisted nematic (TN) mode, a super-twisted nematic (STN) mode, a vertical alignment (VA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, a multi-domain vertical alignment (MVA) mode, a patterned vertical alignment (PVA) mode, an in-plane-switching (IPS) mode, a fringe field switching (FFS) mode, and a transverse bend alignment (TBA) mode. Other examples of the driving method of the display device include an electrically controlled birefringence (ECB) mode, a polymer dispersed liquid crystal (PDLC) mode, a polymer network liquid crystal (PNLC) mode, and a guest-host mode. Note that one embodiment of the present invention is not limited to the above, and various liquid crystal elements and driving methods can be employed.

In the pixel circuit 103a, one of a source electrode and a drain electrode of the transistor 550 is electrically connected to the source line SL, and the other is electrically connected to the other of the pair of electrodes of the liquid crystal element 570. A gate electrode of the transistor 550 is electrically connected to the gate line GL. The transistor 550 has a function of controlling writing of image data by being turned on or off.

One of a pair of electrodes of the capacitor 560 is electrically connected to a wiring supplied with a potential (hereinafter referred to as potential supply line VL), and the other is electrically connected to the other of the pair of electrodes of the liquid crystal element 570. The potential of the potential supply line VL is set as appropriate according to the specifications of the pixel circuit 103a. The capacitor 560 functions as a storage capacitor for storing written data.

For example, in the display device including the pixel circuit 103a in FIG. 8A, the pixel circuits 103a are sequentially selected row by row by the gate driver 101 illustrated in FIG. 7, whereby the transistor 550 is turned on and image data is written.

When the transistor 550 is turned off, the pixel circuit 103a to which the data has been written is brought into a holding state. This operation is sequentially performed row by row; thus, an image can be displayed.

Figure 8B:
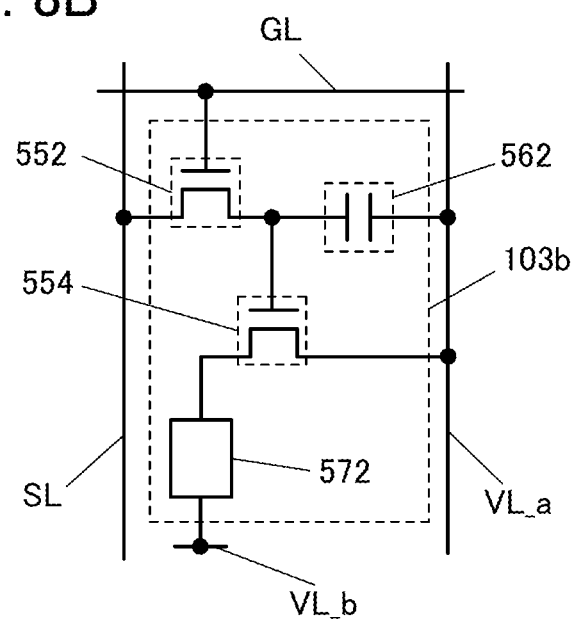

The pixel 103 in FIG. 7 can have a structure illustrated in FIG. 8B, for example.

A pixel circuit 103b illustrated in FIG. 8B includes transistor 552, a transistor 554, a capacitor 562, and a light-emitting element 572.

In the pixel circuit 103b, one of a source electrode and a drain electrode of the transistor 552 is electrically connected to the source line SL. A gate electrode of the transistor 552 is electrically connected to the gate line GL.

The transistor 552 has a function of controlling writing of image data by being turned on or off.

One of a pair of electrodes of the capacitor 562 is electrically connected to a wiring supplied with a potential (hereinafter referred to as potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as organic EL element) can be used, for example. Note that the light-emitting element 572 is not limited to an organic EL element; an inorganic EL element containing an inorganic material may be used.

A high power supply potential VDD is supplied to one of the potential supply line VL_a and the potential supply line VL_b, and a low power supply potential VSS is supplied to the other.

For example, in the display device including the pixel circuit 103b in FIG. 8B, the pixel circuits 103b are sequentially selected row by row by the gate driver 101 illustrated in FIG. 7, whereby the transistor 552 is turned on and image data is written.

When the transistor 552 is turned off, the pixel circuit 103b to which the data has been written is brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

The pixel circuit 103b may be connected to an external compensation circuit in order to compensate for variation in the threshold voltage of the transistor connected to the light-emitting element. An example of this case is illustrated in FIG. 9 and FIG. 10.

Figure 9:
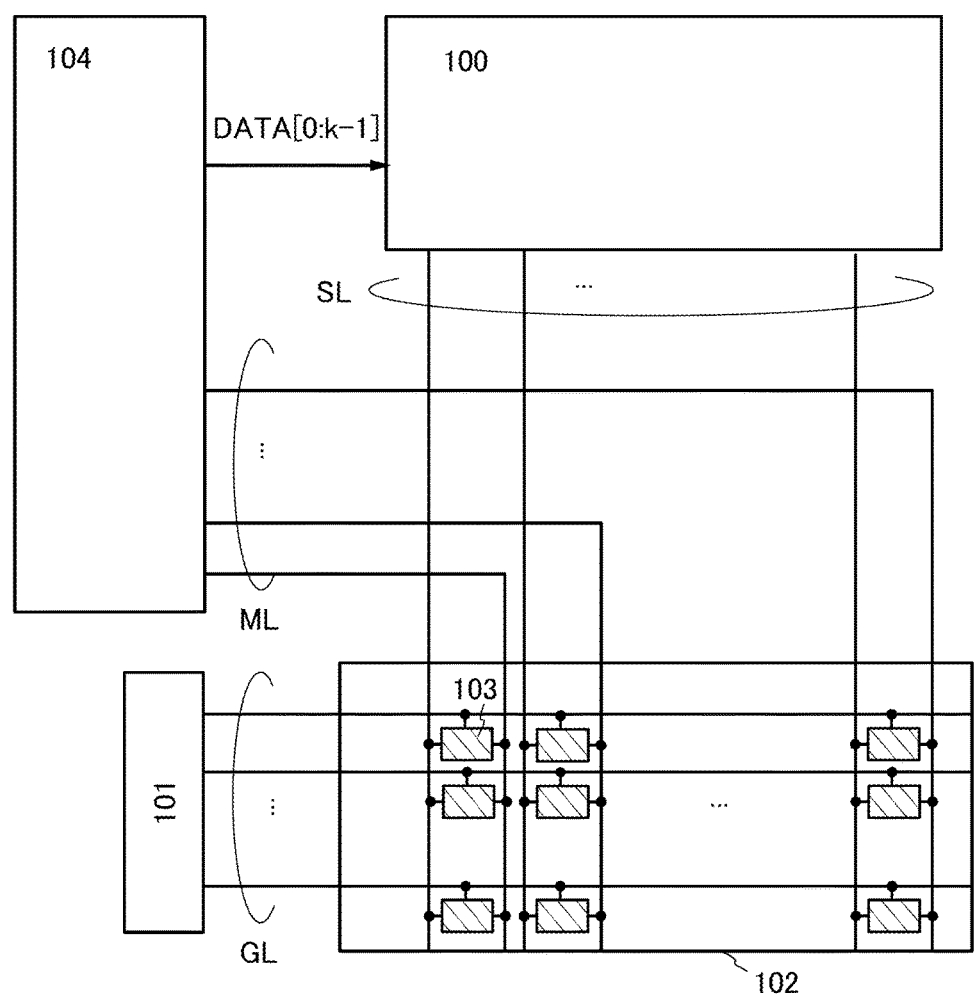
FIG. 9 is a circuit block diagram illustrating a structure example of a display device.
Figure 10:
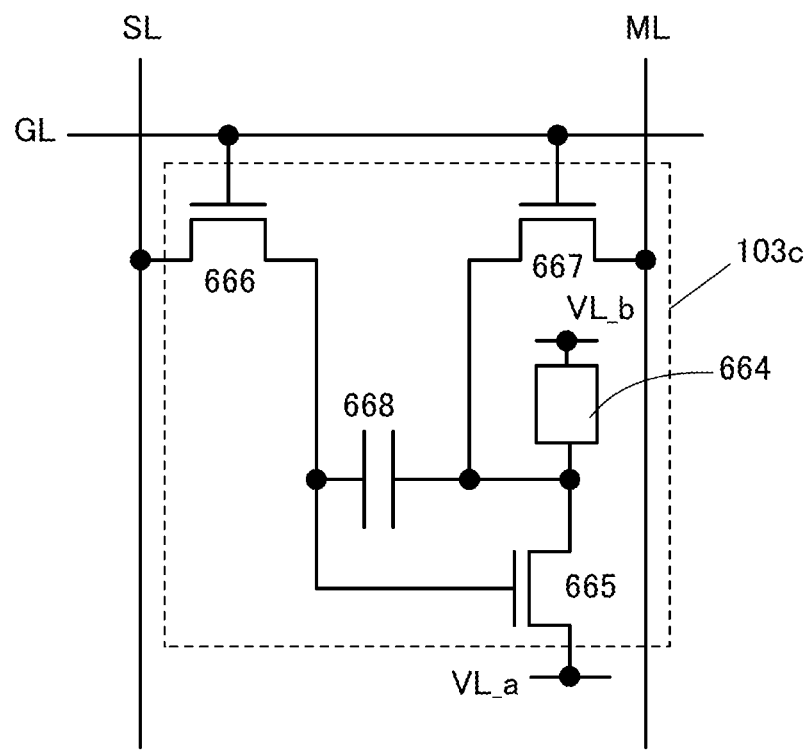
FIG. 10 is a circuit diagram illustrating a structure example of a pixel.

In FIG. 9, a compensation circuit 104 and a plurality of wirings ML are added to the circuit block diagram of the display device in FIG. 7.

Current flowing through the light-emitting elements in the pixels 103 is supplied to the compensation circuit 104 through the wirings ML.

The compensation circuit 104 includes circuits such as a current detection circuit, a memory, an image processing circuit, and a CPU, for example.

The compensation circuit 104 has a function of monitoring a current of the light-emitting element supplied from the pixel 103 and compensating for the data signals DATA[0] to DATA[k-1] input to the source driver 100.

Note that the compensation circuit 104 and the source driver 100 may be included in one driver IC.

The pixel 103 in FIG. 9 can have a structure illustrated in FIG. 10, for example.

A pixel circuit 103c illustrated in FIG. 10 includes transistors 665 to 667, a capacitor 668, and a light-emitting element 664.

In the pixel circuit 103c, the transistor 666 has a function of controlling electrical continuity between the source line SL and a gate of the transistor 665. One of a source and a drain of the transistor 665 is electrically connected to one of an anode and a cathode of the light-emitting element 664, and the other is electrically connected to the potential supply line VL_a. The transistor 667 has a function of controlling electrical continuity between the wiring ML and the one of the source and the drain of the transistor 665. One of a pair of electrodes of the capacitor 668 is electrically connected to the gate of the transistor 665, and the other is electrically connected to the one of the anode and the cathode of the light-emitting element 664. The other of the anode and the cathode of the light-emitting element 664 is electrically connected to the potential supply line VL_b.

The transistors 666 and 667 are switched in accordance with the potential of the gate line GL.

The description of the light-emitting element 572 in FIG. 8B is referred to for the details of the light-emitting element 664.

A current flowing through the light-emitting element 664 is supplied to the compensation circuit 104 through the transistor 667 and the wiring ML. The compensation circuit 104 monitors the current value and compensates for the data signals DATA[0] to DATA[k-1] supplied to the source driver 100.

For example, in this specification and the like, a display element, a display device including a display element, a light-emitting element, and a light-emitting device including a light-emitting element can employ a variety of modes or can include a variety of elements. A display element, a display device, a light-emitting element, or a light-emitting device includes, for example, at least one of an electroluminescent (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube. Other than the above elements, a display medium whose contrast, luminance, reflectivity, transmittance, or the like is changed by an electrical or magnetic effect may be included. Examples of display devices having EL elements include an EL display. Examples of display devices including electron emitters are a field emission display (FED) and an SED-type flat panel display (SED: surface-conduction electron-emitter display). Examples of display devices including liquid crystal elements are a liquid crystal display (e.g., a transmissive liquid crystal display, a transflective liquid crystal display, a reflective liquid crystal display, a direct-view liquid crystal display, and a projection liquid crystal display). Examples of display devices including electronic ink, electronic liquid powder (registered trademark), or electrophoretic elements are electronic paper. In a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as SRAM can be provided under the reflective electrodes, leading to lower power consumption. In the case of using an LED, graphene or graphite may be provided under an electrode or a nitride semiconductor of the LED. Graphene or graphite may be a multilayer film in which a plurality of layers are stacked. Providing graphene or graphite enables a nitride semiconductor (e.g., an n-type GaN semiconductor layer including crystals) to be easily formed thereover. Furthermore, providing a p-type GaN semiconductor layer including crystals or the like thereover can form the LED. Note that an AlN layer may be provided between graphene or graphite and the n-type GaN semiconductor layer including crystals. The GaN semiconductor layers included in the LED may be formed by a metal organic chemical vapor deposition (MOCVD) method. Note that when the graphene is provided, the GaN semiconductor layers included in the LED can also be formed by a sputtering method.

Embodiment 3

In this embodiment, an application example of a semiconductor device including the level-shift circuit described in the foregoing embodiment to an electronic component, an application example of the electronic component to a display module, an application example of the display module, and an application example of the display module to an electronic device will be described with reference to FIGS. 11A and 11B, FIGS. 12A and 12B, FIG. 13, and FIGS. 14A to 14E.

Figure 11A:
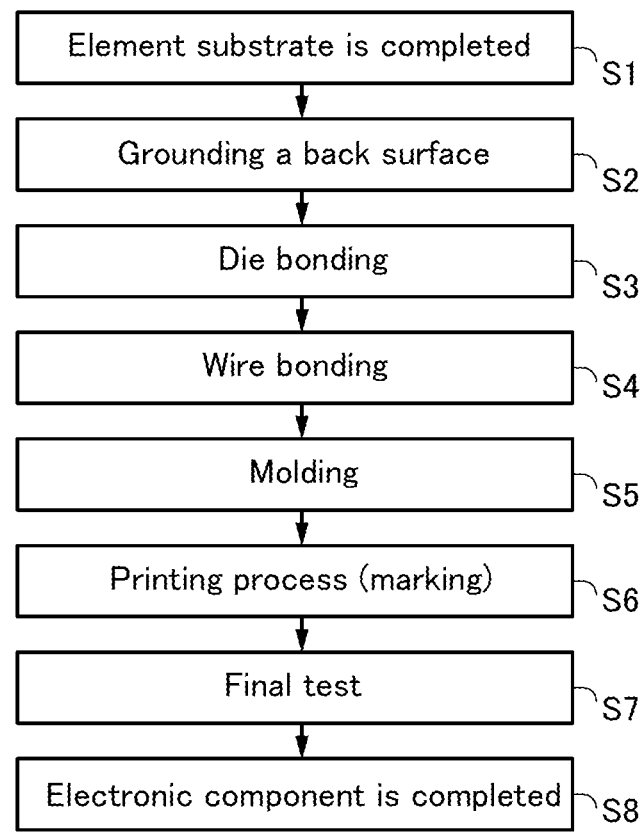
FIG. 11A is a flowchart showing a fabrication process of an electronic component.

FIG. 11A shows an example where a semiconductor device including the level-shift circuit described in the foregoing embodiment is used to manufacture an electronic component. Note that an electronic component is also referred to as a semiconductor package or an IC package. For the electronic component, there are various standards and names corresponding to the direction of terminals or the shape of terminals; hence, one example of the electronic component will be described in this embodiment.

A semiconductor device including a transistor is completed by integrating detachable components on a printed circuit board through the assembly process (post-process).

The post-process can be completed through steps shown in FIG. 11A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

After the back surface of the substrate is ground, a dicing step is performed to divide the substrate into a plurality of chips. Then, a die bonding step of individually picking up separate chips to be mounted on and bonded to an interposer is performed (Step S3). To bond a chip and an interposer in the die bonding step, resin bonding, tape-automated bonding, or the like is selected as appropriate depending on products.

Next, wire bonding for electrically connecting a wire of the interposer and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, printing process (marking) is performed on a surface of the package (Step S6). Then, through a final test step (Step S7), the electronic component is completed (Step S8).

The electronic component described above can include a semiconductor device including the level-shift circuit described in the foregoing embodiment, in which case the electronic component can be miniaturized.

Figure 11B:
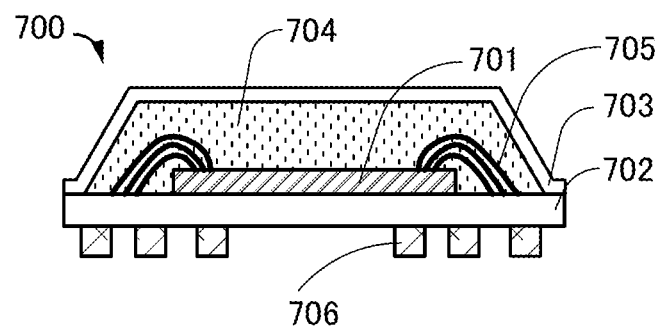
FIG. 11B is a schematic cross-sectional view of the electronic component.

FIG. 11B is a schematic cross-sectional view of a completed electronic component. In an electronic component 700 illustrated in FIG. 11B, a semiconductor device 701 is provided on a surface of an interposer 702. The semiconductor device 701 is connected to a wiring on the surface of the interposer 702 via a wire 705 to be electrically connected to a bump terminal 706 provided on the back surface of the interposer 702. The semiconductor device 701 over the interposer 702 is sealed by a package 703 with a space between the interposer 702 and the package 703 filled with an epoxy resin 704.

The electronic component 700 in FIG. 11B is mounted on a flexible printed circuit (FPC) or a display panel, for example.

Next, examples where the electronic component in FIG. 11B is mounted on a display panel will be described with reference to FIGS. 12A and 12B.

Figure 12A:
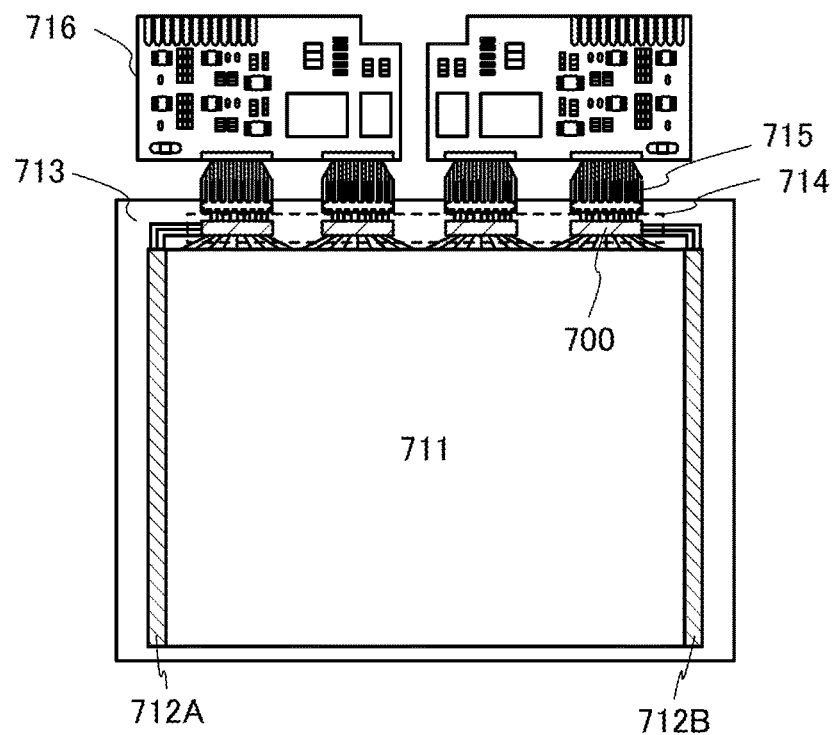
FIGS. 12A and 12B each illustrate a display panel including an electronic component.

FIG. 12A illustrates an example where a source driver 714 and gate drivers 712A and 712B are provided around a display portion 711 and a plurality of electronic components 700 is mounted on a substrate 713 as the source driver 714.

The electronic components 700 are mounted on the substrate 713 using an anisotropic conductive adhesive and an anisotropic conductive film.

The electronic components 700 are connected to an external circuit board 716 via FPCs 715.

Figure 12B:
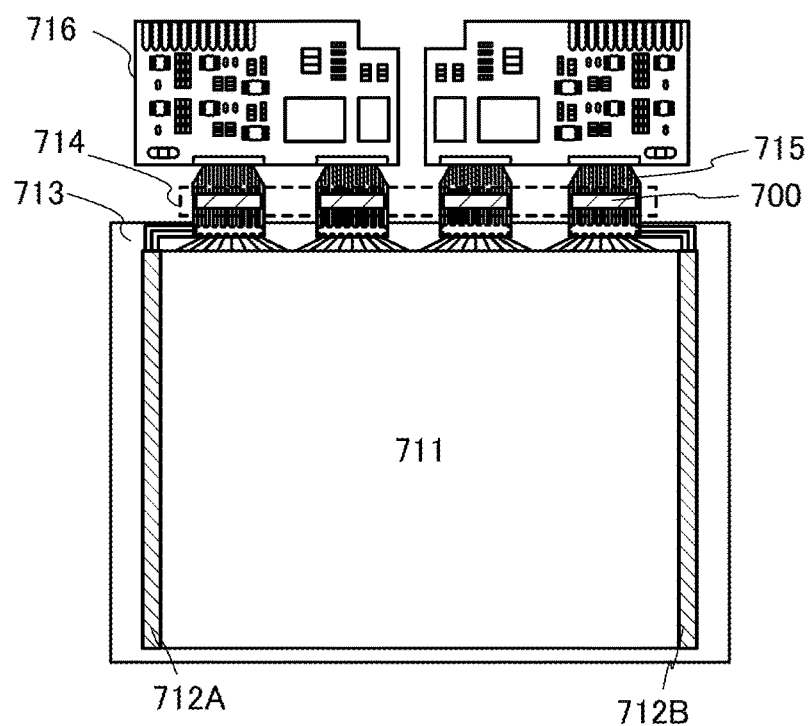

FIG. 12B illustrates an example where the source driver 714 and the gate drivers 712A and 712B are provided around the display portion 711 and a plurality of electronic components 700 is mounted on the FPCs 715 as the source driver 714.

Mounting the electronic components 700 on the FPCs 715 allows a larger display portion 711 to be provided over the substrate 713, resulting in a narrower frame.

Next, an application example of a display module using the display panel illustrated in FIG. 12A or FIG. 12B will be described with reference to FIG. 13.

Figure 13:
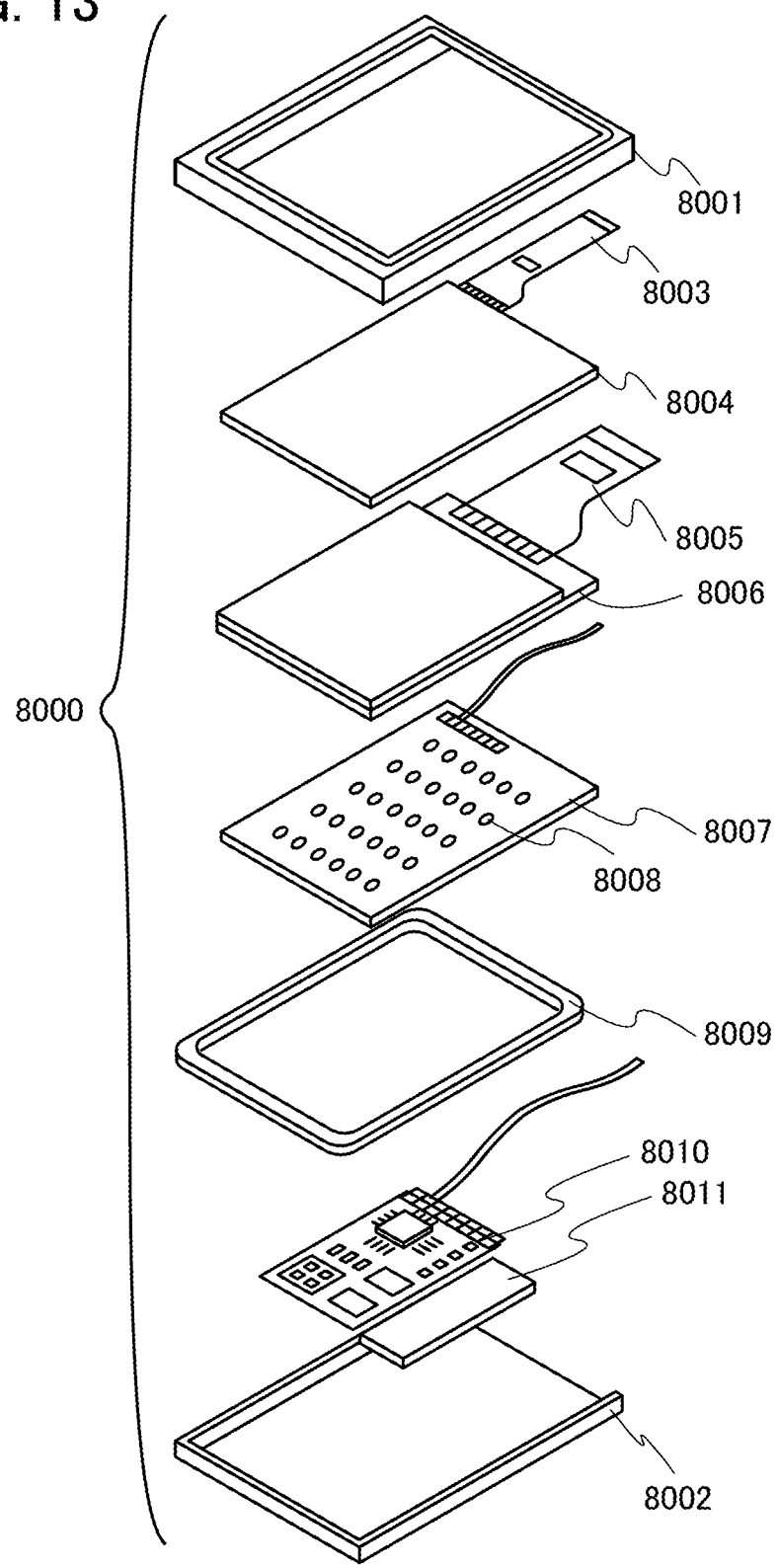
FIG. 13 illustrates a display module including a display panel.

In a display module 8000 illustrated in FIG. 13, a touch panel 8004 connected to an FPC 8003, a display panel 8006 connected to an FPC 8005, a backlight unit 8007, a frame 8009, a printed circuit board 8010, and a battery 8011 are provided between an upper cover 8001 and a lower cover 8002. Note that the backlight unit 8007, the battery 8011, the touch panel 8004, and the like are not provided in some cases.

The display panel illustrated in FIG. 12A or FIG. 12B can be used as the display panel 8006 in FIG. 13.

The shape and size of the upper cover 8001 and the lower cover 8002 can be changed as appropriate in accordance with the size of the touch panel 8004 and the display panel 8006.

The touch panel 8004 can be a resistive touch panel or a capacitive touch panel and can be formed to overlap with the display panel 8006. It is also possible to provide a touch panel function for a counter substrate (sealing substrate) of the display panel 8006. Alternatively, a photosensor may be provided in each pixel of the display panel 8006 to form an optical touch panel. Further alternatively, an electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and functions as an electromagnetic shield for blocking electromagnetic waves generated by the operation of the printed circuit board 8010. The frame 8009 may also function as a radiator plate.

The printed circuit board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a polarizing plate, a retardation plate, a prism sheet, or the like.

Next, the description is made on the case where a display panel including the above electronic component is used as a display panel of an electronic device such as a computer, a portable information appliance (including a mobile phone, a portable game machine, and an audio reproducing device), electronic paper, a television device (also referred to as a television or a television receiver), or a digital video camera.

Figure 14A:
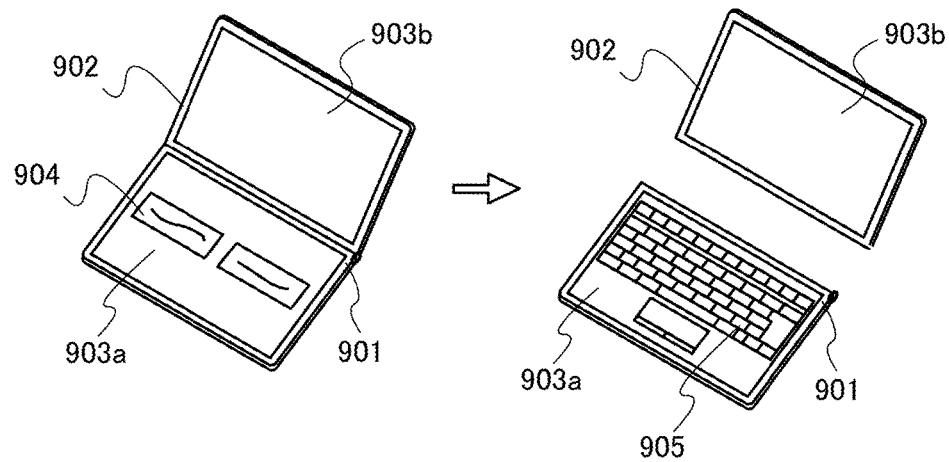
FIGS. 14A to 14E are electronic devices including electronic components.

FIG. 14A illustrates a portable information appliance that includes a housing 901, a housing 902, a first display portion 903a, a second display portion 903b, and the like. At least one of the housings 901 and 902 includes the electronic component including the semiconductor device including the level-shift circuit of the foregoing embodiment. It is thus possible to obtain a small and highly reliable portable information appliance.

The first display portion 903a is a panel having a touch input function, and for example, as illustrated in the left of FIG. 14A, which of "touch input" and "keyboard input" is performed can be selected by a selection button 904 displayed on the first display portion 903a. Since selection buttons with a variety of sizes can be displayed, the information appliance can be easily used by people of any generation. For example, when "keyboard input" is selected, a keyboard 905 is displayed on the first display portion 903a as illustrated in the right of FIG. 14A. Thus, letters can be input quickly by key input as in a conventional information appliance, for example.

In the portable information appliance in FIG. 14A, the second display portion 903b and the housing 902 can be detached from the first display portion 903a and the housing 901 as shown in the right of FIG. 14A. Providing the second display portion 903b with a touch input function makes the information appliance convenient because a weight to carry around can be further reduced and the information appliance can operate with one hand while the other hand supports the housing 902.

The portable information appliance in FIG. 14A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance in FIG. 14A may transmit and receive data wirelessly. Through wireless communication, desired book data or the like can be purchased and downloaded from an e-book server.

In addition, the housing 902 in FIG. 14A may be equipped with an antenna, a microphone function, and a wireless communication function of being used as a mobile phone.

Figure 14B:
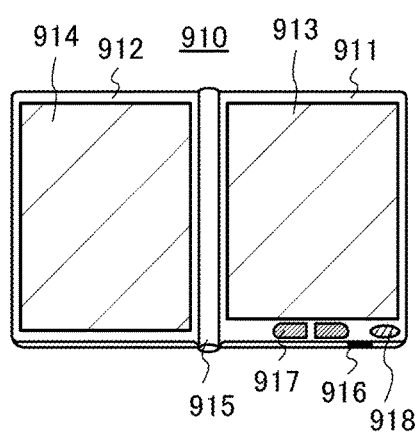

FIG. 14B illustrates an e-book reader 910 including electronic paper. The e-book reader 910 has two housings 911 and 912. The housing 911 and the housing 912 are provided with a display portion 913 and a display portion 914, respectively. The housings 911 and 912 are connected by a hinge 915 and can be opened and closed with the hinge 915 as an axis. The housing 911 is provided with a power switch 916, an operation key 917, a speaker 918, and the like. The electronic component including the semiconductor device including the level-shift circuit of the foregoing embodiment is provided in at least one of the housings 911 and 912. It is thus possible to obtain a small and highly reliable e-book reader.

Figure 14C:
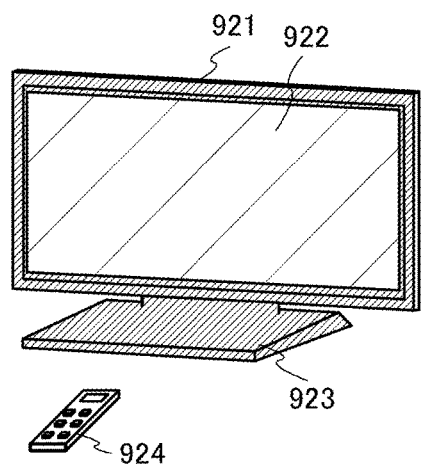

FIG. 14C illustrates a television device including a housing 921, a display portion 922, a stand 923, and the like. The television device can be controlled by a switch of the housing 921 and a remote controller 924. The electronic component including the semiconductor device including the level-shift circuit of the foregoing embodiment is mounted on the housing 921 and the remote controller 924. Thus, it is possible to obtain a small and highly reliable television device.

Figure 14D:
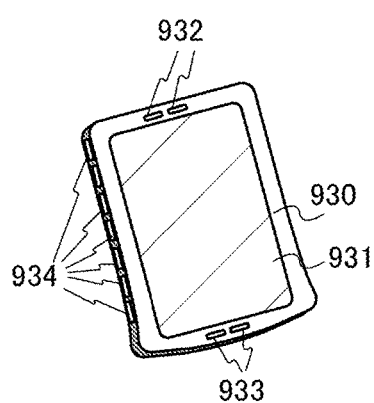

FIG. 14D illustrates a smartphone in which a main body 930 is provided with a display portion 931, a speaker 932, a microphone 933, an operation button 934, and the like. The electronic component including the semiconductor device including the level-shift circuit of the foregoing embodiment is provided in the main body 930. It is therefore possible to obtain a small and highly reliable smartphone.

Figure 14E:
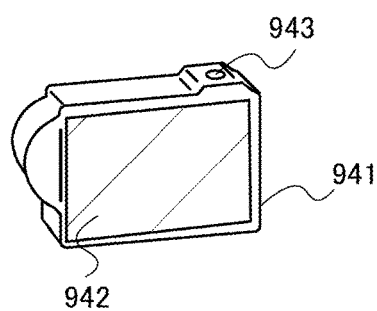

FIG. 14E illustrates a digital camera including a main body 941, a display portion 942, an operation switch 943, and the like. The electronic component including the semiconductor device including the level-shift circuit of the foregoing embodiment is provided in the main body 941. Consequently, it is possible to obtain a small and highly reliable digital camera.

As described above, the electronic devices shown in this embodiment each incorporate the electronic component including the semiconductor device including the level-shift circuit of the foregoing embodiment, thereby being reduced in size and having high reliability.

This application is based on Japanese Patent Application serial no. 2015-255855 filed with Japan Patent Office on Dec. 28, 2015, the entire contents of which are hereby incorporated by reference.

The invention claimed is:

1. A level-shift circuit comprising:
a first transistor;
a second transistor;
a third transistor;
a fourth transistor;
a fifth transistor;
a sixth transistor;
a seventh transistor; and
an eighth transistor,
wherein the first transistor, the second transistor, the fifth transistor, and the sixth transistor are each a p-channel transistor,
wherein the fourth transistor and the eighth transistor are each an n-channel transistor,
wherein the level-shift circuit is configured to boost a first signal having an amplitude voltage between a first voltage and a second voltage to a second signal having an amplitude voltage between a third voltage and the second voltage,
wherein one of a source and a drain of the first transistor is electrically connected to a wiring for transmitting the third voltage,
wherein the other of the source and the drain of the first transistor is electrically connected to one of a source and a drain of the second transistor,
wherein the other of the source and the drain of the second transistor is electrically connected to one of a source and a drain of the third transistor,
wherein the other of the source and the drain of the third transistor is electrically connected to one of a source and a drain of the fourth transistor and a gate of the fifth transistor,
wherein the other of the source and the drain of the fourth transistor is electrically connected to a wiring for transmitting the second voltage,
wherein one of a source and a drain of the fifth transistor is electrically connected to the wiring for transmitting the third voltage,
wherein the other of the source and the drain of the fifth transistor is electrically connected to one of a source and a drain of the sixth transistor,
wherein the other of the source and the drain of the sixth transistor is electrically connected to one of a source and a drain of the seventh transistor,
wherein the other of the source and the drain of the seventh transistor is electrically connected to one of a source and a drain of the eighth transistor and a gate of the first transistor,
wherein the other of the source and the drain of the eighth transistor is electrically connected to the wiring for transmitting the second voltage,
wherein a gate of the second transistor and a gate of the fourth transistor are electrically connected to a wiring for transmitting the first signal,
wherein a gate of the sixth transistor and a gate of the eighth transistor are electrically connected to a wiring for transmitting an inverted signal of the first signal,
wherein a gate of the third transistor and a gate of the seventh transistor are electrically connected to a wiring for transmitting a third signal that controls amounts of current flowing into the one of the source and the drain of the first transistor, the one of the source and the drain of the second transistor, the one of the source and the drain of the fifth transistor, and the one of the source and the drain of the sixth transistor, and
wherein a wiring for transmitting the second signal is electrically connected to the other of the source and the drain of the seventh transistor, the one of the source and the drain of the eighth transistor, and the gate of the first transistor.

2. The level-shift circuit according to claim 1,
wherein the fourth transistor and the eighth transistor each comprise a semiconductor layer where a channel is formed, and
wherein the semiconductor layer comprises an oxide semiconductor.

3. The level-shift circuit according to claim 1, wherein at least one of the fourth transistor and the eighth transistor comprises a back gate.

4. The level-shift circuit according to claim 1, wherein the third transistor and the seventh transistor are each a p-channel transistor.

5. The level-shift circuit according to claim 1,
wherein the third transistor and the seventh transistor are each an n-channel transistor comprising a semiconductor layer where a channel is formed, and
wherein the semiconductor layer comprises an oxide semiconductor.

6. A driver IC comprising:
the level-shift circuit according to claim 1; and
at least one of a shift register, a data latch, a pass transistor logic, a voltage generator circuit, and an amplifier.

7. An electronic device comprising:
the level-shift circuit according to claim 1; and
a display portion.

8. A level-shift circuit comprising:
a first transistor;
a second transistor;
a third transistor;
a fourth transistor;
a fifth transistor;
a first input terminal; and
a first output terminal,
wherein a constant voltage is applied to a gate of the first transistor,
wherein a gate of the second transistor is electrically connected to the first input terminal,
wherein one of a source and a drain of the first transistor is electrically connected to a gate of the third transistor, wherein one of a source and a drain of the second
transistor is directly connected to the gate of the third
transistor,
wherein the other of the source and the drain of the second
transistor is directly connected to a first wiring,
wherein one of a source and a drain of the third transistor
is electrically connected to the first output terminal,
wherein one of a source and a drain of the fourth transistor
is electrically connected to the other of the source and
the drain of the first transistor,
wherein one of a source and a drain of the fifth transistor
is electrically connected to the first output terminal,
wherein the other of the source and the drain of the fifth
transistor is directly connected to the first wiring,
wherein the other of the source and the drain of the third
transistor is electrically connected to a second wiring,
and
wherein the other of the source and the drain of the fourth
transistor is electrically connected to the second wiring.

9. The level-shift circuit according to claim 8,
wherein a signal having an amplitude voltage between a
first voltage and a second voltage is input to the first
input terminal,
wherein the first wiring is configured to transmit the
second voltage,
wherein the second wiring is configured to transmit a third
voltage, and
wherein a voltage difference between the third voltage
and the second voltage is larger than a voltage difference between the first voltage and the second voltage,
and
wherein the constant voltage is between the first voltage
and the third voltage.

10. The level-shift circuit according to claim 9, further
comprising:
a sixth transistor;
a seventh transistor;
an eighth transistor;
a second input terminal; and
s second output terminal,
wherein a gate of the sixth transistor is electrically connected to the first input terminal,
wherein the one of the source and the drain of the fourth
transistor is electrically connected to the other of the
source and the drain of the first transistor though the
sixth transistor,
wherein the one of the source and the drain of the second
transistor is electrically connected to the second output
terminal,
wherein a gate of the fifth transistor is electrically connected to the second input terminal,
wherein the constant voltage is applied to a gate of the
seventh transistor,
wherein a gate of the eighth transistor is electrically
connected to the second input terminal, and
wherein the one of the source and the drain of the third
transistor is electrically connected to the first output
terminal through the seventh transistor and the eighth
transistor.

11. The level-shift circuit according to claim 8,
wherein the first transistor, the third transistor, and the
fourth transistor are each a p-channel transistor, and
wherein the second transistor and the fifth transistor are
each an n-channel transistor.

12. The level-shift circuit according to claim 11,
wherein the n-channel transistor comprises a semiconductor layer where a channel is formed, and
wherein the semiconductor layer comprises an oxide
semiconductor.

13. A level-shift circuit comprising:
a first transistor;
a second transistor;
a third transistor;
a fourth transistor;
a fifth transistor;
a sixth transistor;
a seventh transistor;
an eighth transistor;
a first terminal for transmitting a signal;
a second terminal;
a third terminal for transmitting a constant voltage;
a fourth terminal for transmitting an inverted signal;
a fifth terminal; and
a sixth terminal,
wherein the first transistor, the second transistor, the fifth
transistor, and the sixth transistor are each a p-channel
transistor,
wherein the fourth transistor and the eighth transistor are
each an n-channel transistor,
wherein one of a source and a drain of the first transistor
is electrically connected to the fifth terminal,
wherein the other of the source and the drain of the first
transistor is electrically connected to one of a source
and a drain of the second transistor,
wherein the other of the source and the drain of the second
transistor is electrically connected to one of a source
and a drain of the third transistor,
wherein the other of the source and the drain of the third
transistor is electrically connected to one of a source
and a drain of the fourth transistor and a gate of the fifth
transistor,
wherein the other of the source and the drain of the fourth
transistor is electrically connected to the sixth terminal,
wherein one of a source and a drain of the fifth transistor
is electrically connected to the fifth terminal,
wherein the other of the source and the drain of the fifth
transistor is electrically connected to one of a source
and a drain of the sixth transistor,
wherein the other of the source and the drain of the sixth
transistor is electrically connected to one of a source
and a drain of the seventh transistor,
wherein the other of the source and the drain of the
seventh transistor is electrically connected to one of a
source and a drain of the eighth transistor and a gate of
the first transistor,
wherein the other of the source and the drain of the eighth
transistor is electrically connected to the sixth terminal,
wherein a gate of the second transistor and a gate of the
fourth transistor are electrically connected to the first
terminal,
wherein a gate of the sixth transistor and a gate of the
eighth transistor are electrically connected to the fourth
terminal,
wherein a gate of the third transistor and a gate of the
seventh transistor are electrically connected to the third
terminal, and
wherein the second terminal is electrically connected to
the other of the source and the drain of the seventh
transistor, the one of the source and the drain of the
eighth transistor, and the gate of the first transistor.

14. The level-shift circuit according to claim 13,
wherein the fourth transistor and the eighth transistor each
comprise a semiconductor layer where a channel is
formed, and wherein the semiconductor layer comprises an oxide semiconductor.

15. The level-shift circuit according to claim 14, the oxide semiconductor includes at least one of indium and gallium.

16. The level-shift circuit according to claim 14, wherein the fourth transistor and the eighth transistor are over the first transistor, the second transistor, the fifth transistor, and the sixth transistor with an insulator therebetween.

17. The level-shift circuit according to claim 13, wherein at least one of the fourth transistor and the eighth transistor comprises a back gate.

18. The level-shift circuit according to claim 13, wherein the third transistor and the seventh transistor are each a p-channel transistor.

19. The level-shift circuit according to claim 13,
wherein the third transistor and the seventh transistor are each an n-channel transistor comprising a semiconductor layer where a channel is formed, and
wherein the semiconductor layer comprises an oxide semiconductor.

20. The level-shift circuit according to claim 19,
wherein the oxide semiconductor includes at least one of indium and gallium.

* * * * *